United States Patent
Chen et al.

(10) Patent No.: US 6,982,606 B2
(45) Date of Patent: Jan. 3, 2006

(54) METHOD AND DEVICE FOR DYNAMICALLY CALIBRATING FREQUENCY

(75) Inventors: Chun-Hsiung Chen, Hsinchu (TW); Sheng-Ho Wang, Sijhih (TW)

(73) Assignee: Holtek Semiconductor Inc., Hsinchu (TW)

( * ) Notice: Subject to any disclaimer, the term of this patent is extended or adjusted under 35 U.S.C. 154(b) by 95 days.

(21) Appl. No.: 10/818,815

(22) Filed: Apr. 6, 2004

(65) Prior Publication Data

US 2004/0201403 A1  Oct. 14, 2004

(30) Foreign Application Priority Data

Apr. 11, 2003  (TW) .................................. 92108484

(51) Int. Cl.
*H03L 1/00* (2006.01)

(52) U.S. Cl. .................... 331/175; 331/74; 331/176; 331/143; 327/261; 327/39; 713/322

(58) Field of Classification Search ................ 327/261, 327/39; 713/322; 331/143, 175, 176, 74
See application file for complete search history.

(56) References Cited

U.S. PATENT DOCUMENTS

| | | | | |
|---|---|---|---|---|
| 5,805,909 A | * | 9/1998 | Diewald ..................... | 713/322 |
| 6,084,441 A | * | 7/2000 | Kawai ........................ | 327/99 |
| 6,653,871 B2 | * | 11/2003 | Masuda et al. ............... | 327/99 |

* cited by examiner

*Primary Examiner*—Arnold Kinkead
(74) *Attorney, Agent, or Firm*—Volpe and Koenig, P.C.

(57) ABSTRACT

The method and the device thereof for dynamically calibrating a frequency is provided. The method includes steps of: (a) providing a first system frequency; (b) obtaining a first parameter of timer counting number; (c) providing a second system frequency; (d) obtaining a second parameter of timer counting number if there is a frequency drift between said first system frequency and said second system frequency; (e) obtaining a third parameter of timer interrupt interval by comparing said first parameter of timer counting number with said second parameter of timer counting number; and (f) calibrating a frequency output according to said third parameter of timer interrupt interval.

14 Claims, 2 Drawing Sheets

METHOD AND DEVICE FOR DYNAMICALLY CALIBRATING FREQUENCY

FIELD OF THE INVENTION

The present invention relates to a method and a device for dynamically calibrating a frequency, and more particularly to a method and a device for dynamically calibrating a frequency by software.

BACKGROUND OF THE INVENTION

In a traditional remote control for household or industrial appliances, the quartz oscillator is generally used for generating an accurate carrier-wave frequency. An additional quartz oscillator for a real-time function is needed if the remote control is provided with the function of time display or timer etc. Due to the higher cost of the quartz oscillator, the cost of the device will be raised. However, the lower cost achieved by using cheaper RC oscillator often results in the drift of the frequency, because the inaccuracy of the resistor and the capacitance is large. Besides, the RC oscillator is easily influenced by external environment conditions such as temperature alteration. Therefore, it is necessary that a more expensive quartz oscillator or a complex circuit such as phase lock loop must be applied, so as to calibrate the frequency in the application which requires the accuracy of the frequency. And thus the costs of the making and the designing of the integrated circuit are very high.

Hence, in order to overcome the drawbacks of the inaccuracy of the RC oscillator in the prior art, a method and a device for dynamically calibrating a frequency are highly needed in the industry.

SUMMARY OF THE INVENTION

It is an object of the present invention to provide a microcontroller with a real time clock (RTC) to calibrate a system frequency generated by a RC oscillator by software, and so as to adjust an output frequency generated by a frequency generator.

In accordance with one aspect of the present invention, the method for dynamically calibrating a frequency includes steps of: (a) providing a first system frequency; (b) obtaining a first parameter of timer counting number; (c) providing a second system frequency; (d) obtaining a second parameter of timer counting number if there is a frequency drift between the first system frequency and the second system frequency; (e) obtaining a third parameter of timer interrupt interval by comparing the first parameter of timer counting number with the second parameter of timer counting number; and (f) calibrating a frequency output according to the third parameter of timer interrupt interval.

Preferably, the first and the second system frequencies are generated by a resistor-capacitance oscillator.

Preferably, step (b) is performed by steps of: (b1) obtaining a parameter of RTC interrupt interval according to a datum frequency and a specific bit number; (b2) obtaining a first parameter of timer preload number according to the first system frequency; a carrier-wave frequency and the specific bit number; (b3) obtaining a first parameter of timer net number according to the first parameter of timer preload number and the specific bit number; (b4) obtaining a first parameter of timer interrupt interval according to the first parameter of timer net number and the first system frequency; and (b5) obtaining the first parameter of timer counting number according to the first parameter of timer interrupt interval and the parameter of RTC interrupt interval.

Preferably, the specific bit number is a bit number for a counter.

Preferably, the specific bit number is 8.

Preferably, step (d) is performed by steps of: (d1) obtaining a second parameter of timer interrupt interval according to the first parameter of timer net number and the second system frequency; and (d2) obtaining the second parameter of timer counting number according to the second parameter of timer interrupt interval and the parameter of RTC interrupt interval.

Preferably, the step (e) is performed by steps of: (e1) obtaining a gain by dividing a difference between the first parameter of timer counting number and the second parameter of timer counting number by a parameter of minimum deviation divider; (e2) obtaining a second parameter of timer preload number according to the first parameter of timer preload number; (e3) obtaining a second parameter of timer net number according to the second parameter of timer preload number and the specific bit number; and (e4) obtaining a third parameter of timer interrupt interval according to the second parameter of timer net number and the second system frequency.

Preferably, the parameter of minimum deviation divider is a difference between the first parameter of timer interrupt interval and a parameter of minimum deviation counts.

Preferably, the parameter of minimum deviation counts is a parameter of timer counting number of a drift frequency unit.

In accordance with another aspect of the present invention, the device dynamically calibrating a frequency for calibrating an output frequency of a frequency generator includes a microcontroller with a counter having a parameter of timer interrupt interval electrically connecting to the frequency generator; and a resistor-capacitance oscillator formed by a resistor and a capacitance in series connection, and electrically connected to the microcontroller, and having a datum frequency and a system frequency, wherein the microcontroller corrects the parameter of timer interrupt interval of the counter according to the datum frequency and the system frequency.

Preferably, the frequency generator is operated according to the parameter of timer interrupt interval.

Preferably, the counter is an 8-bit counter.

Preferably, the datum frequency is generated by a quartz oscillator.

Preferably, the quartz oscillator is electrically connected to the microcontroller.

The foregoing and other features and advantages of the present invention will be more clearly understood through the following descriptions with reference to the drawings, wherein:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Generally, there is a quartz oscillator with a frequency of 32.768 KHz in an infrared remote for displaying time. The frequency is perfectly accurate to be a datum frequency for calibrating other frequencies. The carrier-wave frequency of the infrared remote is generally 37.92 KHz or 56.9 KHz. Take the quartz oscillator with a frequency of 37.92 KHz as an example and apply it to an 8-bit counter, the output frequency generated by a RC oscillator is adjusted according to the parameter of timer interrupt interval of the 8-bit counter.

Figure 1:
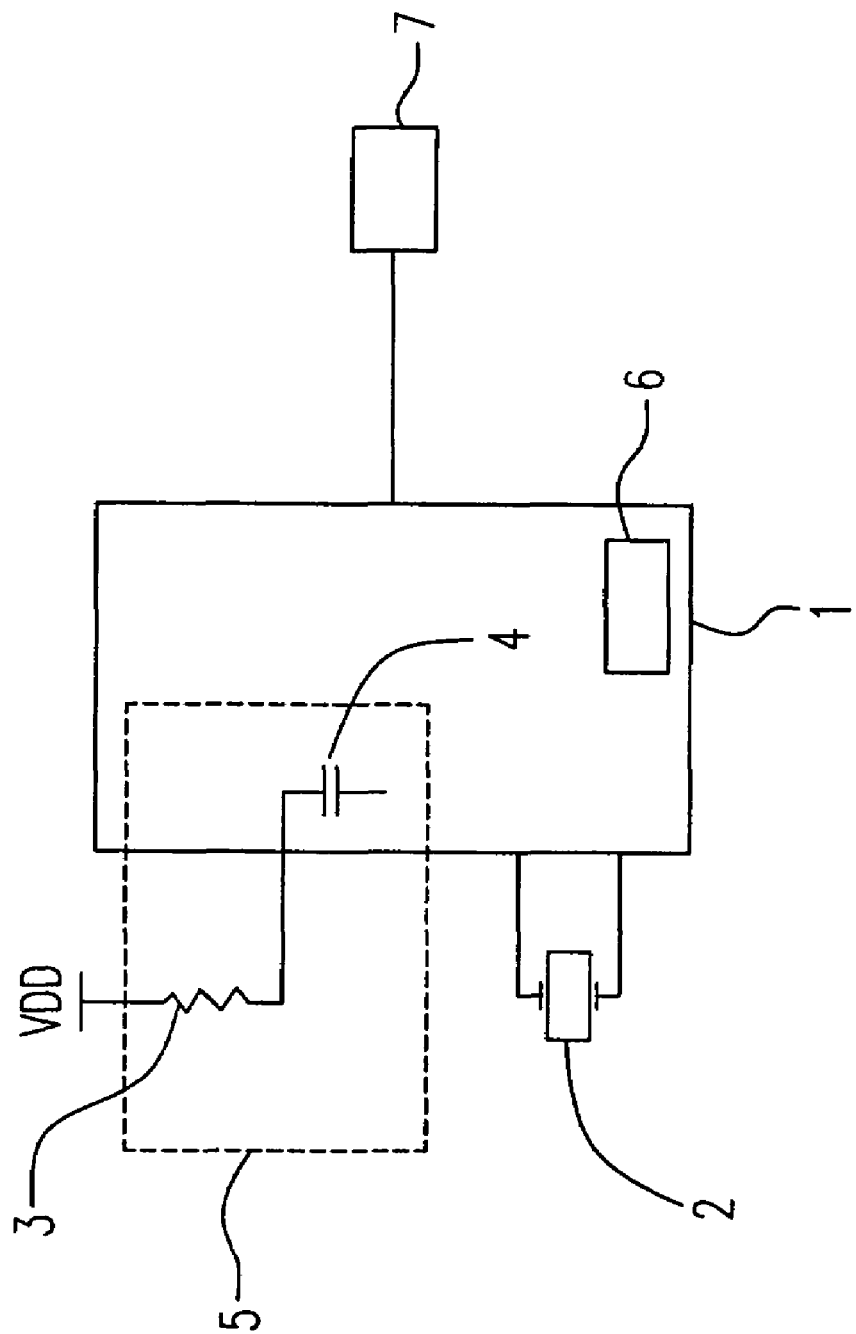
FIG. 1 is a schematic diagram showing the operating components of the device dynamically calibrating the frequency according to a preferred embodiment of the present invention.

Please refer to FIG. 1, which is a schematic diagram showing the operating components according to a preferred embodiment of the present invention. The parameter of timer interrupt interval is calculated by the counter 6 in the microcontroller (MCU) 1 with respect to the system frequency according to the datum frequency. The system frequency is generated by the RC oscillator 5 which is consisted of the resistor 3 and the capacitance 4. The datum frequency is generated by the quartz oscillator 2. The parameter of timer interrupt interval is then controlled by software in order to calibrate an output frequency generated by the frequency generator 7.

The reference frequency of the RC oscillator 5 is assumed 4550 KHz which is served as the first system frequency. (Because 4550 KHz could be the multiple frequency of both the 37.92 KHz and 56.9 KHz carrier-wave frequency of the infrared remote.) When the RC oscillator is influenced by the alteration of the external environment condition, such as the temperature change or the manufacturing processes, which results in the second system frequency of 7000 KHz, based on the datum frequency 32.768 KHz generated by the RTC (real-time clock), a parameter of timer interrupt interval is generated by comparing the parameter of timer interrupt interval with respect to the first system frequency of 4550 KHz and the parameter of timer interrupt interval with respect to the second system frequency of 7000 KHz. Subsequently, the parameter of timer interrupt interval with respect to the second system frequency of 7000 KHz is corrected or adjusted to approximate the parameter of timer interrupt interval with respect to the first system frequency of 4550 KHz. Therefore, the output frequency of the RC oscillator could be calibrated and a carrier-wave frequency of 37.92 KHz could be generated by the RC oscillator.

Figure 2:
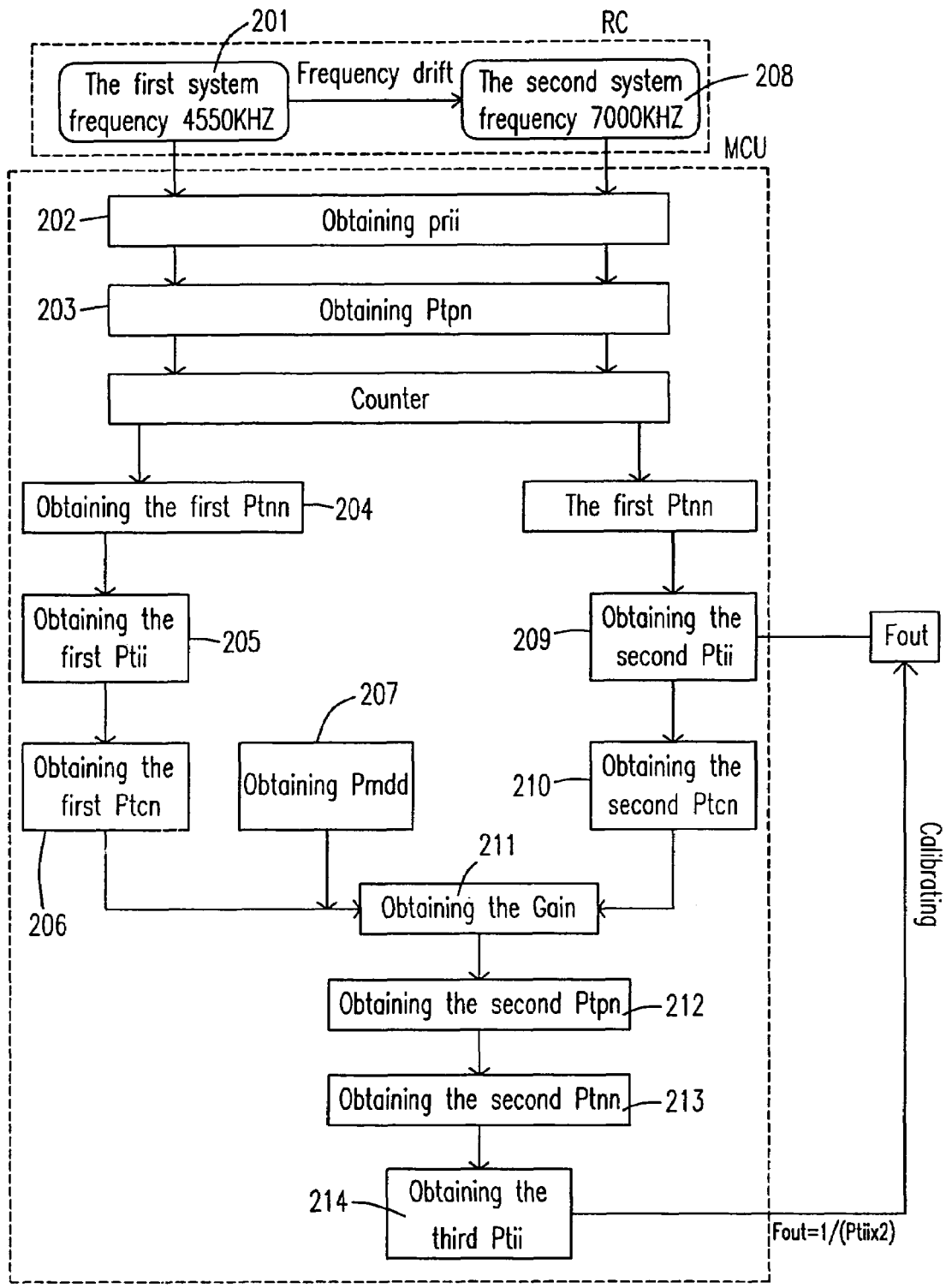
FIG. 2 is a flow chart showing the calibrating method according to a preferred embodiment of the present invention.

Please refer to FIG. 2, which is a flow chart showing the calibrating method according to a preferred embodiment of the present invention.

In step 201, the first system frequency of 4550 KHz is provided. In step 202, the parameter of RTC interrupt interval (Prii) is obtained according to the datum frequency and the specific bit number of 8 by the following equation:

$$Prii32768 = 1/(32.768 \text{ KHz}/2^8) = 1/128 \text{ Hz} = 7.8125 \text{ mS}$$

In step 203, the first parameter of timer preload number (Ptpn) is obtained according to the first system frequency of 4550 KHz, the carrier-wave frequency of 37.92 KHz and the specific bit number of 8 by the following equation:

$$Ptpn4550K = 2^8 - 4550 \text{ KHz}/(37.92 \text{ KHz} \times 2) = 196$$

In step 204, the first parameter of timer net number (Ptnn) is obtained according to the first parameter of timer preload number and the specific bit number of 8 by the following equation:

$$Ptnn4550K = 2^8 - Ptpn4550K = 60$$

In step 205, the first parameter of timer interrupt interval (Ptii) is obtained according to the the first parameter of timer net number and the first system frequency by the following equation:

$$Ptii4550K = (1/4550 \text{ KHz}) \times Ptnn4550K = 13.1868 \ \mu S$$

In step 206, the first parameter of timer counting number (Ptcn) is obtained according to the first parameter of timer interrupt interval and the parameter of RTC interrupt interval by the following equation:

$$Ptcn4550K = Prii32768/Ptii4550K = 592$$

In step 207, the parameter of minimum deviation counts (Pmdc) is obtained according to the first parameter of timer net number by the following equation:

$$Pmdc4550K = Prii32768/[Ptii4550K \times (Ptnn4550K+1)/Ptnn4550K] = 582 \text{ or}$$

$$Pmdc4550K = Prii32768/[Ptii4550K \times (Ptnn4550K-1)/Ptnn4550K] = 602$$

And thus the parameter of minimum deviation divider (Pmdd) is obtained according to the parameter of minimum deviation counts (Pmdc) and Ptcn4550K by the following equation:

$$Pmdd4550K = Ptcn4550K - Pmdc4550K = 592 - 582 = 10$$
or
$$Pmdd4550K = Pmdc4550K - Ptcn4550K = 602 - 592 = 10$$

Therefore, the maximum deviation is as follows:

$$MD = \pm Pmdd4550K/Pmdc4550K \times 100\% = \pm 1.7\%$$

It can be seen that if the datum frequency is 32.768 KHz and the carrier-wave frequency of 37.92 KHz is generated by the 8-bit counter according to the first system frequency of 4550 KHz, the deviation is just only ±1.7%. It is very accurate compared with the common infrared remote that the deviation relief thereof is 15%.

In step 208, the second system frequency of 7000 KHz is generated when the RC oscillator is influenced by the alteration of the external environment condition. In steps 209 and 210, the second parameter of timer interrupt interval (Ptii) and parameter of timer counting number (Ptcn) are obtained according to the same equations in steps 205 and 206, respectively, as follows:

$$Ptii7000K = (1/7000 \text{ KHz}) \times Ptnn4550K = 8.5714 \ \mu S$$

$$Ptcn7000K = Prii32768/Ptii7000K = 911$$

In step 211, the gain is obtained by dividing the difference between the first parameter of timer counting number and the second parameter of timer counting number by a parameter of minimum deviation divider by the following equation:

$$Gain = (911 - 592)/10 = 32$$

In step 212, the second parameter of timer preload number is obtained according to the first parameter of timer preload number by the following equation:

$$Ptpn7000K=2^8-[Ptnn4550K+(Ptcn7000K-Ptcn4550K)/Pmdd4550K]=Ptpn4550K-(911-592)/10=164$$

In step 213, the second parameter of timer net number is obtained according to the second parameter of timer preload number and the specific bit number of 8 by the following equation:

$$Ptnn7000K=256-Ptpn7000K=92$$

In step 214, the third parameter of timer interrupt interval is obtained according to the second parameter of timer net number and the second system frequency by the following equation:

$$Ptii7000K=(1/7000\ KHz)\times Ptnn7000K=13.1429\ \mu S$$

And thus the output frequency $F_{out}$ should be as follows:

$$F_{out}=1/(Ptii7000K\times 2)=38.043\ KHz$$

By comparing the third parameter of timer interrupt interval of 13.1429 $\mu S$ with the first parameter of timer interrupt interval of 13.1868 $\mu S$, the rectifying deviation should be as follows:

$$RD7000K=(13.1868\ \mu S-13.1429\ \mu S)/13.1868\ \mu S\times 100\%=+0.333\%$$

It can be seen that the result is very accurate.

Moreover, the deviation of the RC oscillator could be ±30% because of the process inaccuracy of the capacitance in IC circuit. Take the second system frequency of 7000 KHz as an example, the variation range of the frequency could be between 4900 KHz and 9100 KHz. According to that, the respective calibrating parameter of timer interrupt interval could be as follows:

$$Ptii4900K=13.2653\ \mu S$$

$$Ptii9100K=13.0769\ \mu S$$

And thus the respective rectifying deviation should be as follows:

$$RD4900K=(13.1868\ \mu S-13.2653\ \mu S)/13.1868\ \mu S\times 100\%=+0.595\%$$

$$RD9100K=(13.1868\ \mu S-13.0769\ \mu S)/13.1868\ \mu S\times 100\%=-0.833\%$$

It can be seen that the deviations in the above are both acceptable.

Therefore, when the frequency drift occurs in the RC oscillator, the parameter of timer net number of the desired ouput frequency in the system frequency could be calibrated by the microcontroller according to the method and the device provided in the present invention. No matter how the external environment condition changes, the output frequency could be calibrated dynamically by the user before every operation. The output frequency is also ensured its accuracy according to the present invention.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claim is:

1. A method for dynamically calibrating a frequency comprising steps of:
    (a) providing a first system frequency;
    (b) obtaining a first parameter of timer counting number;
    (c) providing a second system frequency;
    (d) obtaining a second parameter of timer counting number if there is a frequency drift between said first system frequency and said second system frequency;
    (e) obtaining a third parameter of timer interrupt interval by comparing said first parameter of timer counting number with said second parameter of timer counting number; and
    (f) calibrating a frequency output according to said third parameter of timer interrupt interval.

2. The method according to claim 1, wherein said first and said second system frequencies are generated by a resistor-capacitance oscillator.

3. The method according to claim 1, wherein said step (b) is performed by steps of:
    (b1) obtaining a parameter of RTC interrupt interval according to a datum frequency and a specific bit number;
    (b2) obtaining a first parameter of timer preload number according to said first system frequency, a carrier-wave frequency and said specific bit number;
    (b3) obtaining a first parameter of timer net number according to said first parameter of timer preload number and said specific bit number;
    (b4) obtaining a first parameter of timer interrupt interval according to said first parameter of timer net number and said first system frequency; and
    (b5) obtaining said first parameter of timer counting number according to said first parameter of timer interrupt interval and said parameter of RTC interrupt interval.

4. The method according to claim 3, wherein said specific bit number is a bit number for a counter.

5. The method according to claim 3, wherein said specific bit number is 8.

6. The method according to claim 3, wherein said step (d) is performed by steps of:
    (d1) obtaining a second parameter of timer interrupt interval according to said first parameter of timer net number and said second system frequency; and
    (d2) obtaining said second parameter of timer counting number according to said second parameter of timer interrupt interval and said parameter of RTC interrupt interval.

7. The method according to claim 3 wherein said step (e) is performed by steps of:
    (e1) obtaining a gain by dividing a difference between said first parameter of timer counting number and said second parameter of timer counting number by a parameter of minimum deviation divider;
    (e2) obtaining a second parameter of timer preload number according to said first parameter of timer preload number;
    (e3) obtaining a second parameter of timer net number according to said second parameter of timer preload number and said specific bit number; and (e4) obtaining a third parameter of timer interrupt interval according to said second parameter of timer net number and said second system frequency.

8. The method according to claim 7, wherein said parameter of minimum deviation divider is a difference between said first parameter of timer interrupt interval and a parameter of minimum deviation counts.

9. The method according to claim 8, wherein said parameter of minimum deviation counts is a parameter of timer counting number of a drift frequency unit.

10. A device dynamically calibrating a frequency for calibrating an output frequency of a frequency generator, comprising:
   a microcontroller with a counter having a parameter of timer interrupt interval electrically connecting to said frequency generator; and
   a resistor-capacitance oscillator formed by a resistor and a capacitance in series connection, and electrically connected to said microcontroller, and having a datum frequency and a system frequency,
   wherein said microcontroller corrects said parameter of timer interrupt interval of said counter according to said datum frequency and said system frequency.

11. The device according to claim 10, wherein said frequency generator is operated according to said parameter of timer interrupt interval.

12. The device according to claim 10, wherein said counter is an 8-bit counter.

13. The device according to claim 10, wherein said datum frequency is generated by a quartz oscillator.

14. The device according to claim 10, wherein said quartz oscillator is electrically connected to said microcontroller.

* * * * *